US012785321B2

(12) United States Patent
Bischoff et al.

(10) Patent No.: US 12,785,321 B2
(45) Date of Patent: Nov. 3, 2026

(54) ELECTRICALLY INSULATING TEST CAP FOR A HIGH-VOLTAGE CONTACT, A HOUSING WITH AN ELECTRICALLY INSULATING TEST CAP AND A HIGH-VOLTAGE BOX

(71) Applicant: TE Connectivity Solutions GmbH, Schaffhausen (CH)

(72) Inventors: Daniel Bischoff, Bensheim (DE); Matthias Wefers, Neckartenzlingen (DE)

(73) Assignee: TE Connectivity Solutions GmbH, Schaffhausen (DE)

( * ) Notice: Subject to any disclaimer, the term of this patent is extended or adjusted under 35 U.S.C. 154(b) by 341 days.

(21) Appl. No.: 18/645,443

(22) Filed: Apr. 25, 2024

(65) Prior Publication Data

US 2024/0364047 A1 Oct. 31, 2024

(30) Foreign Application Priority Data

Apr. 28, 2023 (DE) .......................... 102023111113.2

(51) Int. Cl.
*H01R 13/53* (2006.01)
*G01R 31/16* (2006.01)
*H01R 13/502* (2006.01)

(52) U.S. Cl.
CPC ............. *H01R 13/53* (2013.01); *G01R 31/16* (2013.01); *H01R 13/502* (2013.01)

(58) Field of Classification Search
None
See application file for complete search history.

(56) References Cited

U.S. PATENT DOCUMENTS 4,891,016 A * 1/1990 Luzzi ..................... H01R 13/53 439/372
6,717,293 B1 4/2004 Irvine et al.
(Continued)

FOREIGN PATENT DOCUMENTS

EP 2871719 A1 * 5/2015 ........... H01R 43/002
JP 2011174846 A 9/2011
JP 5764442 B2 8/2015

OTHER PUBLICATIONS

Extended European Search Report for European Application No. 24172790.8 dated Oct. 1, 2024.
(Continued)

*Primary Examiner* — Tho D Ta
(74) *Attorney, Agent, or Firm* — Potomac Law Group PLLC

(57) ABSTRACT

The invention relates to an electrically insulating test cap for a high-voltage contact, comprising a base body, at least one test opening piercing the base body, wherein a tubular sheathing encloses the test opening and leads away from the base body in a longitudinal direction of the sheathing. Further, the invention relates to a housing for a high voltage box comprising a housing wall, a test cap according to the invention, wherein the test cap extends through the housing wall into the interior of the housing. Furthermore, the invention relates to a high-voltage box comprising a housing according to the invention or an outer wall accommodating an electrically insulating test cap and a high-voltage board with a test contact arranged at the level of the test cap.

19 Claims, 10 Drawing Sheets

(56) References Cited

U.S. PATENT DOCUMENTS

Figure 1:
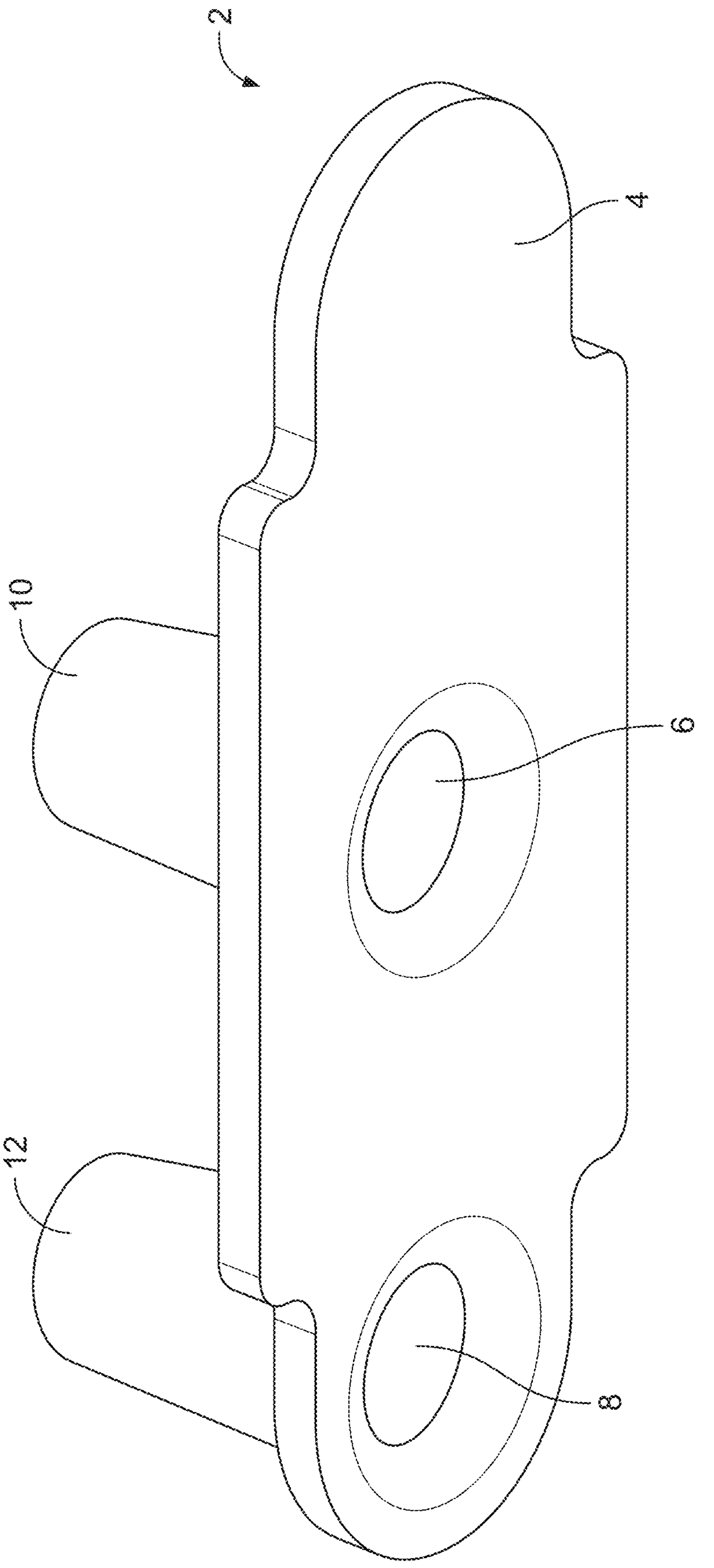

| | | | | |
|---|---|---|---|---|
| 9,293,872 | B2 * | 3/2016 | Mikli ................. | H01R 13/6315 |
| 2011/0025342 | A1 | 2/2011 | Siebens | |
| 2014/0082938 | A1 | 3/2014 | King, Jr. et al. | |
| 2015/0015234 | A1 | 1/2015 | Ayanegui et al. | |
| 2021/0005410 | A1 | 1/2021 | Nguyen et al. | |

OTHER PUBLICATIONS

Unknown, “Keysight 10076C High Voltage Probe,” Keysight Technologies, 4 pages, Aug. 1, 2018.

German Search Report for GermanApplication No. 102023111113.2 dated Jan. 17, 2024.

* cited by examiner

ELECTRICALLY INSULATING TEST CAP FOR A HIGH-VOLTAGE CONTACT, A HOUSING WITH AN ELECTRICALLY INSULATING TEST CAP AND A HIGH-VOLTAGE BOX

This application claims priority to and the benefit of German Patent Application No. 102023111113.2 filed Apr. 28, 2023, which is hereby incorporated by reference in its entirety.

The present invention relates to an electrically insulating test cap for a high-voltage contact, a housing with an electrically insulating test cap and a high-voltage box with such a test cap.

A high-voltage box is primarily used in high-voltage applications to store components carrying high voltages in a sealed or closed box. Thus, protection can be provided against access to life-threatening high-voltage components.

In some cases, it may be necessary to access components inside the high-voltage box, for example during maintenance or repair of the high-voltage box. In this case, before opening the high-voltage box, it should be ensured that no life-threatening voltage is present on a circuit board of the high-voltage box or the remaining components inside the high-voltage box.

Some high-voltage (HV) interlock systems allow an interruption signal to be sent to a control unit of the high-voltage box when a high-voltage box is opened, so that the high-voltage supply to the high-voltage box is interrupted. This process is also referred to as "de-energizing". Nevertheless, an HV interlock system cannot always guarantee that there is no dangerous high voltage inside the high-voltage box. For example, capacitive components—such as capacitors—can maintain a high voltage even long after a power supply has been switched off or interrupted.

Furthermore, some high-voltage box systems attempt to reduce the risk posed by capacitive components in that separate test cables run from a circuit board arranged inside the high-voltage box to a housing wall in order to provide test contacts with the circuit board. This allows a high voltage to be measured at the test contact when the high-voltage box is open. Typically, such test contacts on a high-voltage board are high-voltage contacts.

However, the test cables, which transmit the electrical potential of the circuit board to the test contact, constitute a further source of error when checking the electrical voltage of the circuit board. In addition, opening the high-voltage box before checking the high voltage poses a further safety risk.

Therefore, the problem underlying the present invention is to increase the operational safety or maintenance safety of a high-voltage box.

This problem is solved by an electrically insulating test cap for a high-voltage contact, comprising a base body and at least one test opening piercing the base body, wherein a tubular sheathing encloses the test opening and leads away from the base body in a longitudinal direction of the sheathing.

Advantageously, a test contact arranged on the side of the sheathing can be contacted with a test pin through the test opening.

The invention can be further improved by the following configurations, each of which is preferred individually and can be combined with one another as desired.

The tubular sheathing is, for example, a sleeve that extends away from the base body of the test cap. The sheathing can, for example, be rotationally symmetrical in shape and taper, preferably in a longitudinal direction leading away from the base body.

According to a further preferred configuration, the base body can have a flange shape. Alternatively or cumulatively, the base body can be plate-shaped or disk-shaped. Preferably, the side of the base body opposite the sheathing is flat. Thus, the base body preferably has a flat side that could be abutted planarly against a flat surface.

According to a further preferred configuration, the flat side of the base body can be perpendicular to a direction of expansion of the shortest edge of the base body.

According to a further preferred configuration, the base body can have two opposite flat sides, wherein the test opening pierces or penetrates the two flat sides.

According to a further preferred configuration, the test cap can consist in sections of a translucent material.

According to a further preferred configuration, at least one coding element can project from the inside of the sheathing transversely to the longitudinal direction of the sheathing.

According to a further preferred configuration, the coding element can project radially. In particular, the coding element can disrupt the radial symmetry of the inside of the sheathing.

According to a further preferred configuration, the coding element can be a coding rib. In particular, the coding rib or the coding element can project from the sheathing into the test opening.

According to a further preferred configuration, in addition to the test opening, the test cap can have an additional test opening piercing the base body. The additional test opening can be configured analogously to the test opening of the test cap described first. In particular, the additional test opening can be enclosed by an additional tubular sheathing, wherein the additional sheathing extends away from the base body in the same longitudinal direction.

According to a further preferred configuration, the test cap can have at least two or three test openings.

According to a further preferred configuration, the test openings can be identically configured except for a coding element arranged on the inside of the sheathing of the respective test opening. In particular, one of the test openings can be provided without a coding element, whereas the remaining test openings are provided with a coding element.

According to a further preferred configuration, the test opening or the test openings can extend in an axial direction away from the base body, wherein the axial directions of the test opening and the additional test opening are parallel to each other. In other words, the longitudinal direction can correspond to the axial direction or the two directions can be identical.

According to a further preferred configuration, an additional coding element can project from the inside of the additional sheathing, wherein in a cross-sectional plane to the longitudinal direction an outer contour of the coding element differs from an outer contour of the additional coding element.

According to a further preferred configuration, the coding element can have a constant outer contour along the longitudinal direction. In other words, the outer contour of the coding element remains unchanged along the longitudinal direction.

According to a further preferred configuration, the additional coding element can be arranged offset from the position of the coding rib along the longitudinal direction.

According to a further preferred configuration, the additional coding element has an outer contour that differs from that of the coding element. In this context, an outer contour is defined as the outer contour of the coding element in a perpendicular section to the longitudinal direction.

According to a further preferred configuration, the at least one test opening or the additional test opening can have a predetermined diameter. In other words, the diameter can have a function-dependent expansion and thus corresponds to a function-dependent diameter. In this case, the function can be predetermined by an element interacting with the diameter. For example, the amount of diameter can be limited by a test pin that is inserted through the test opening. This can prevent an unintended test pin from being accidentally used with the test opening. Preferably, the diameter cannot fall below the specified diameter along the longitudinal direction. For example, the diameter can be 10 mm, 11 mm or 12 mm. If the sheathing of a test opening tapers in the shape of a truncated cone, the specified diameter is the smallest diameter of the truncated cone shape.

According to a further preferred configuration, a distal end of the at least one test opening or additional test opening may be no more than a predetermined distance away from the base body. The predetermined distance can be a function-dependent distance. Thus, the size or the amount of the distance can fulfill a function. For example, the predetermined distance reflects a minimum length of a test pin to be inserted into the test opening. The distance thus ensures that no unintended test pin can reach the test contact behind the test opening. For example, the specified distance can be 60 mm, 65 mm, 70 mm, 75 mm, 80 mm, 85 mm or 90 mm.

According to a further preferred configuration, the sheathing or additional sheathing can taper away from the base body.

In particular, the sheathing or additional sheathing can be in the shape of a truncated cone or run in the shape of a truncated cone. In this case, the base of the truncated cone can be located on the base body or the opening of the sheathing on the truncated side can be arranged distally from the base body.

According to a further preferred configuration, the problem underlying the invention is solved by a housing for a high-voltage box, wherein the housing comprises a housing wall and a test cap according to the invention and wherein the test cap extends through the housing wall into the interior of the housing.

According to a further preferred configuration, the sheathing can be arranged inside the housing.

According to another preferred configuration, the base body can abut against an outside of the housing wall.

According to a further preferred configuration, the base body of the test cap can seal a hole (or a recess) in the housing wall penetrated by the test cap. In particular, the outer edge of the base body can have a seal arranged on the side of the sheathing.

According to a further preferred configuration, the housing wall can have a recess into which the test cap according to the invention is inserted.

According to a further preferred configuration, the problem underlying the invention is solved by a high-voltage box, wherein the high-voltage box comprises a housing according to the invention and a high-voltage board with a test contact arranged at the level of the test cap.

Alternatively, the problem underlying the invention can be solved by a high-voltage box which comprises an outer wall accommodating the test cap according to the invention, wherein a high-voltage board is provided with a test contact arranged at the level of the test cap.

In both cases, the housing or high-voltage box according to the invention accommodates the high-voltage board inside. In other words, the circuit board is arranged in the housing or in the high-voltage box. Furthermore, the housing or high-voltage box according to the invention may have other components carrying high voltages. For example, busbars, relays, fuses, diodes, capacitors and/or coils may be mentioned here.

According to a further preferred configuration, the test opening can be arranged flush with the test contact of the high-voltage board. In particular, a test contact can be arranged flush with a test opening.

According to a further preferred configuration, the high-voltage box can comprise an additional high-voltage board—preferably with at least one additional test contact—wherein the at least one additional test contact is arranged at the level of the additional test opening of the test cap.

Thus, several high-voltage boards can be tested from the outside through just one test cap.

According to a further preferred configuration, the high-voltage board can have at least two electrically separate high-voltage circuits, wherein the circuits are each provided with separate or adjacent test contacts and wherein the adjacent test contacts are accessible through the test cap.

According to a further preferred configuration, the high-voltage box can have a test pin, wherein the test pin is provided with a rod-like contact tip receptacle and wherein the contact tip receptacle comprises a recess for receiving a coding element of the test cap. In particular, the recess of the test pin can be configured to complement the coding element or its outer contour.

According to a further preferred configuration, the recess of the test pin can run along the longitudinal direction. In particular, the longitudinal direction of the test pin corresponds to the longitudinal direction or axial direction of the sheathing of the test cap—at least when the test pin is inserted into the test opening.

According to a further preferred configuration, the coding element of the test cap can be an optical waveguide. Advantageously, the optical waveguide can conduct an optical test signal from an electrical light source on the high-voltage board to the outside. In particular, the light source can be an electrical light source, such as a light-emitting diode.

According to a further preferred configuration, the high-voltage board can have a light source arranged flush with the test cap, which can signal the presence of a high voltage on the high-voltage board. For example, the light source lights up when a high voltage is present and is otherwise inactive or emits no light.

According to a further preferred configuration, an optically transparent and electrically insulating barrier can be arranged between the light source and the test cap. The barrier can also be located on the side of the base body opposite the sheathing.

According to a further preferred configuration, the material of the test cap can be translucent in sections.

According to a further preferred configuration, a switch that can be operated from the outside through the test opening can be arranged flush with the test opening on the circuit board.

In particular, according to a further preferred configuration, the test contact may comprise the switch. For example, the switch can be a dual in-line package (DIP) switch.

In the following, the invention is explained in more detail by means of preferred configurations with reference to the drawings. The preferred developments and configurations shown here are each independent of one another and can be combined with one another as desired, depending on how this is necessary in the application. For the sake of simplicity, elements and functions that are present in several configurations are explained only once, if necessary.

Figure 2:
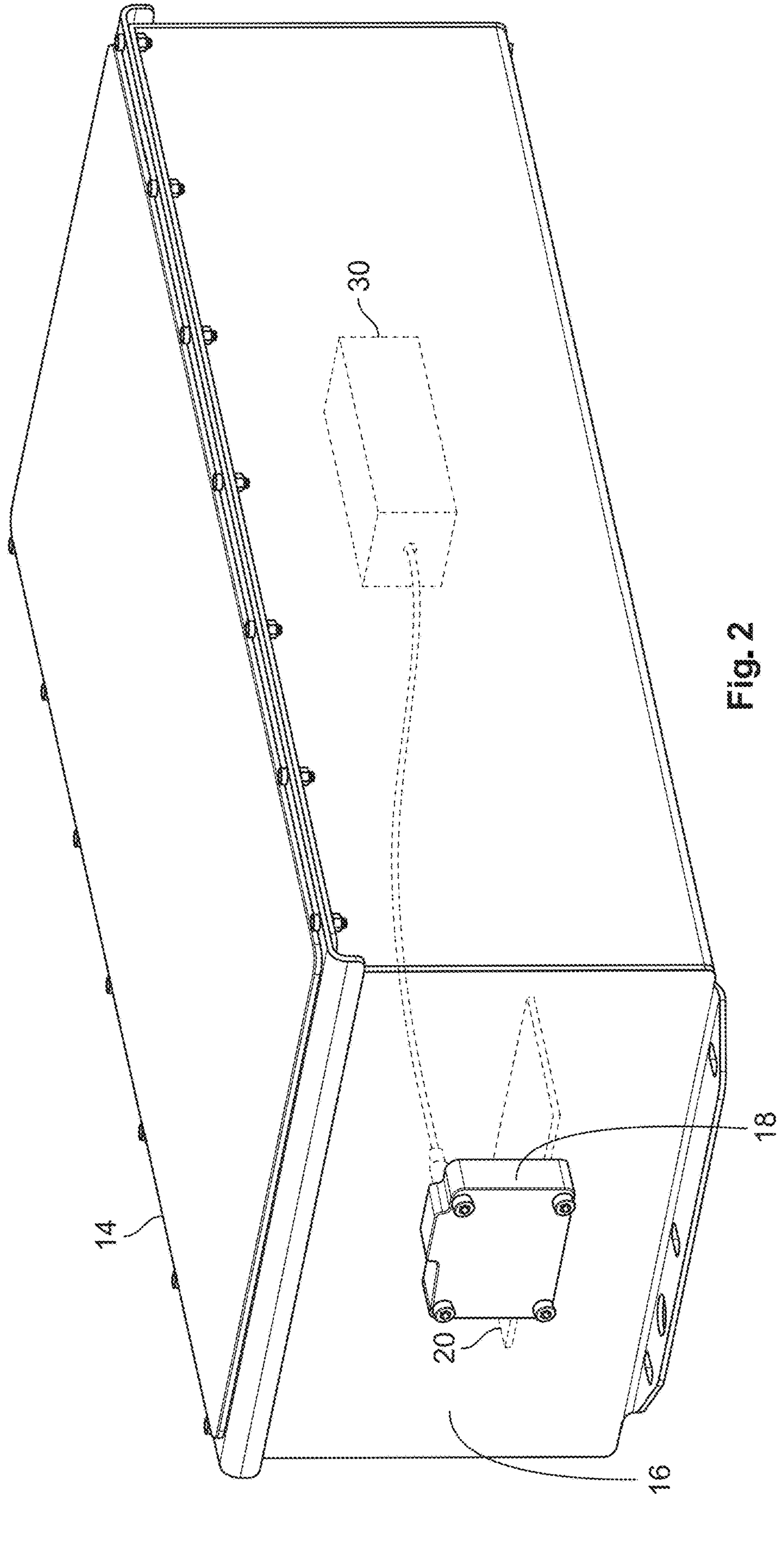
Figure 3:
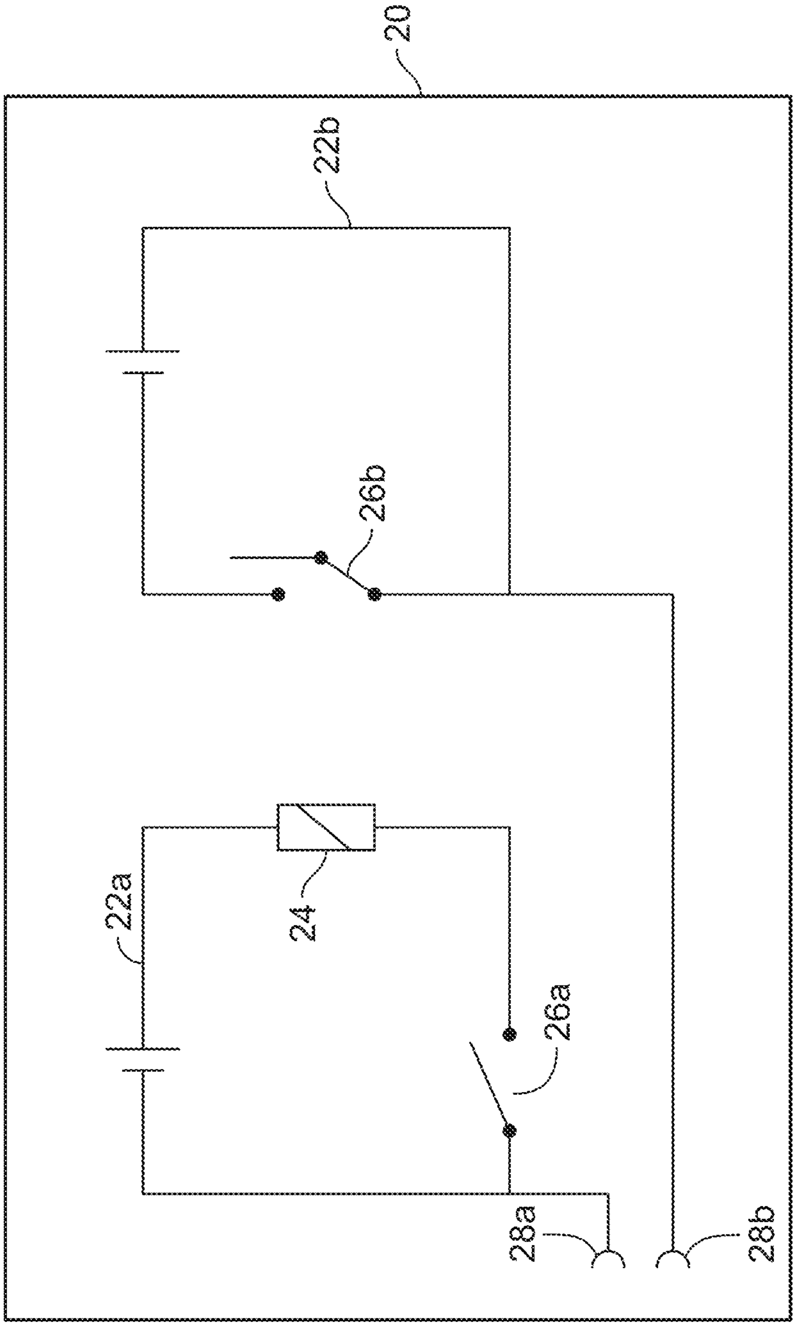
Figure 4:
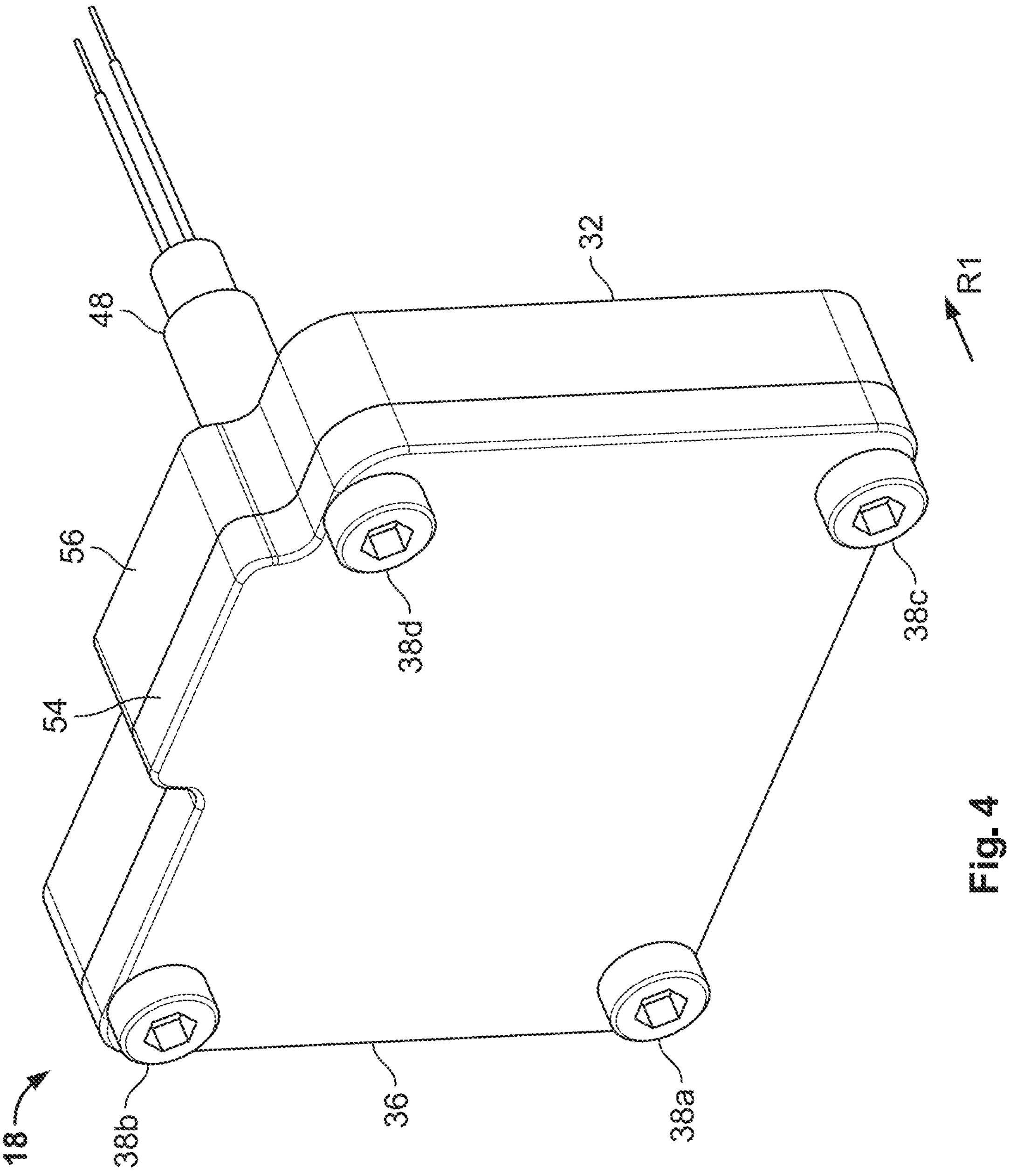
Figure 5:
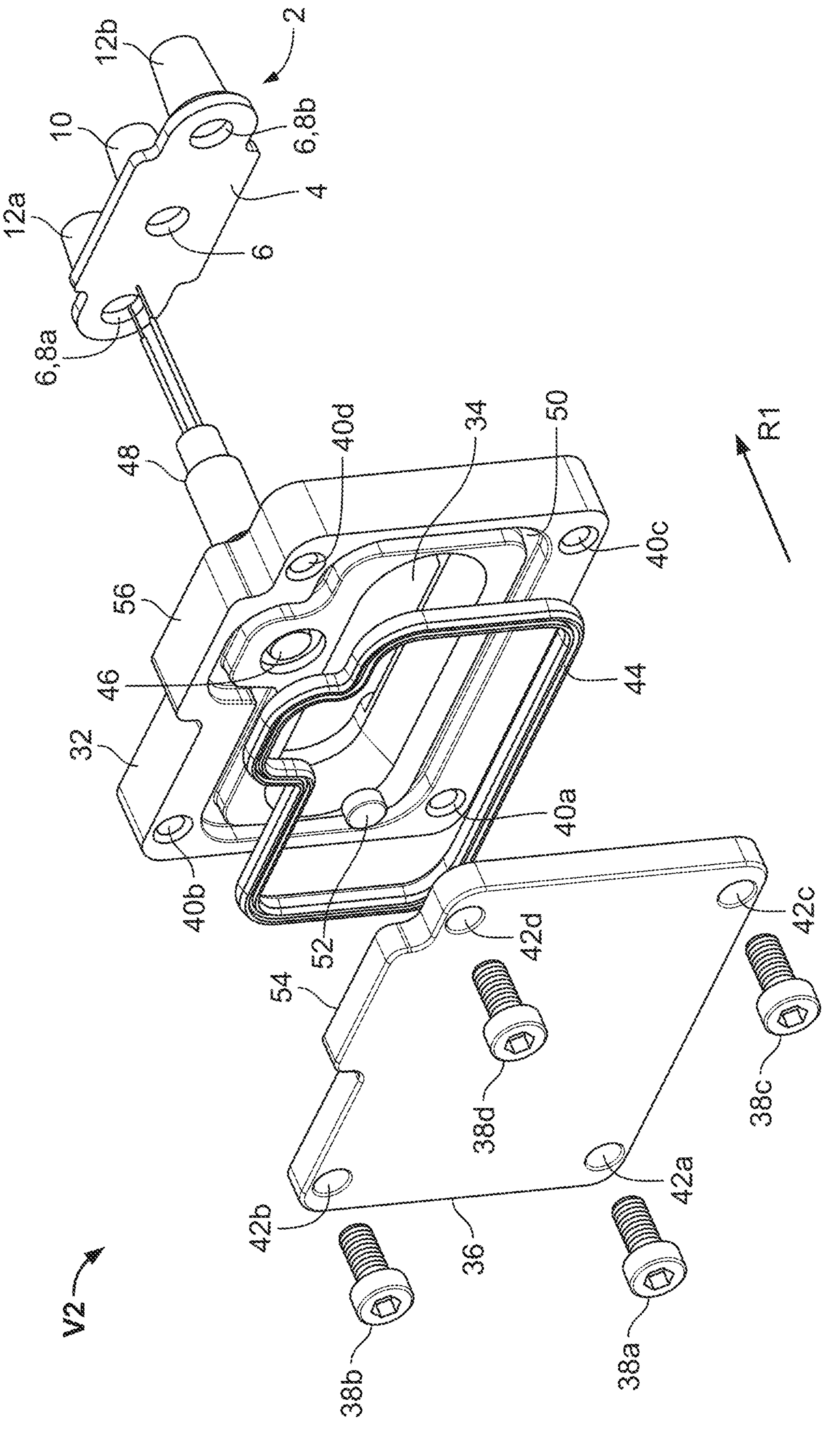
Figure 6B:
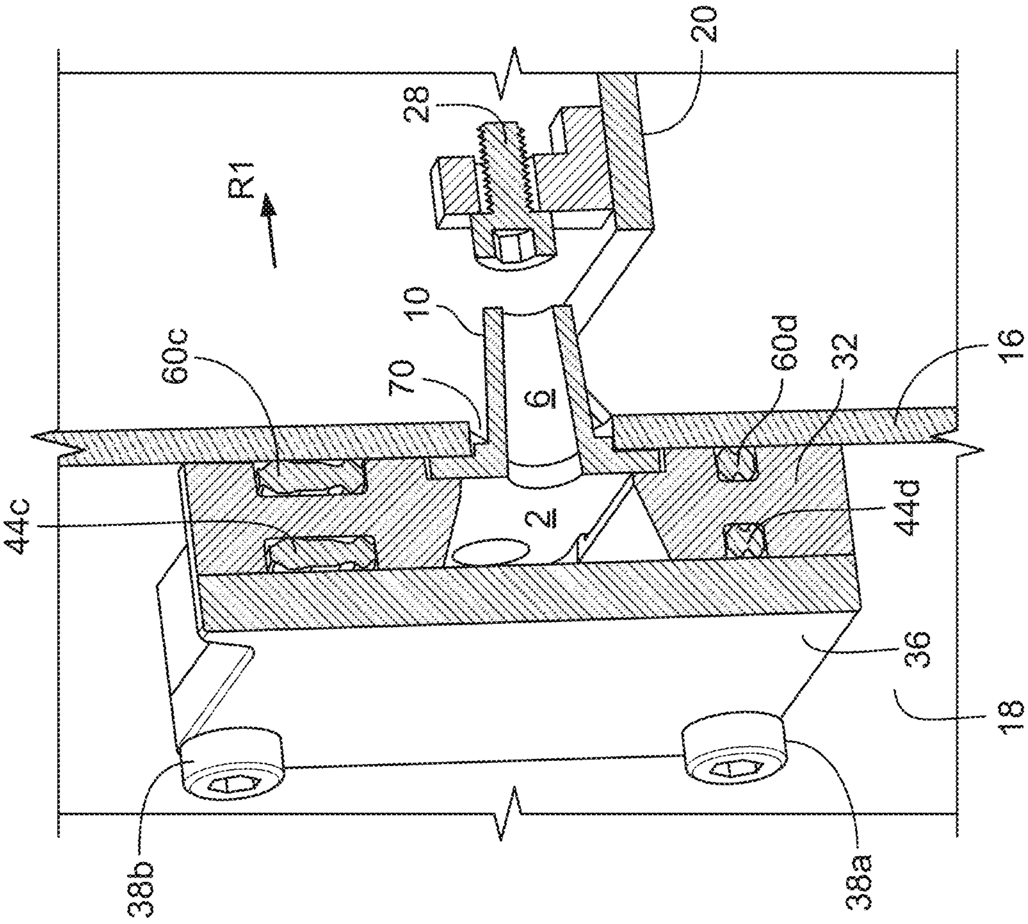
Figure 6A:
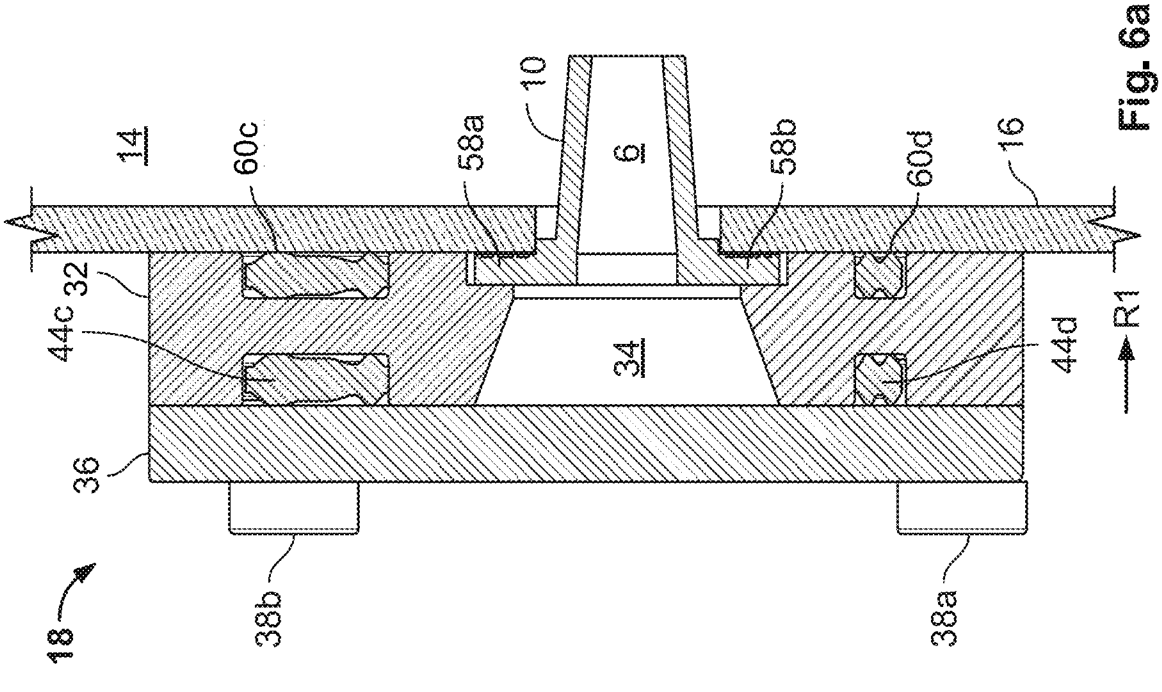
Figure 7B:
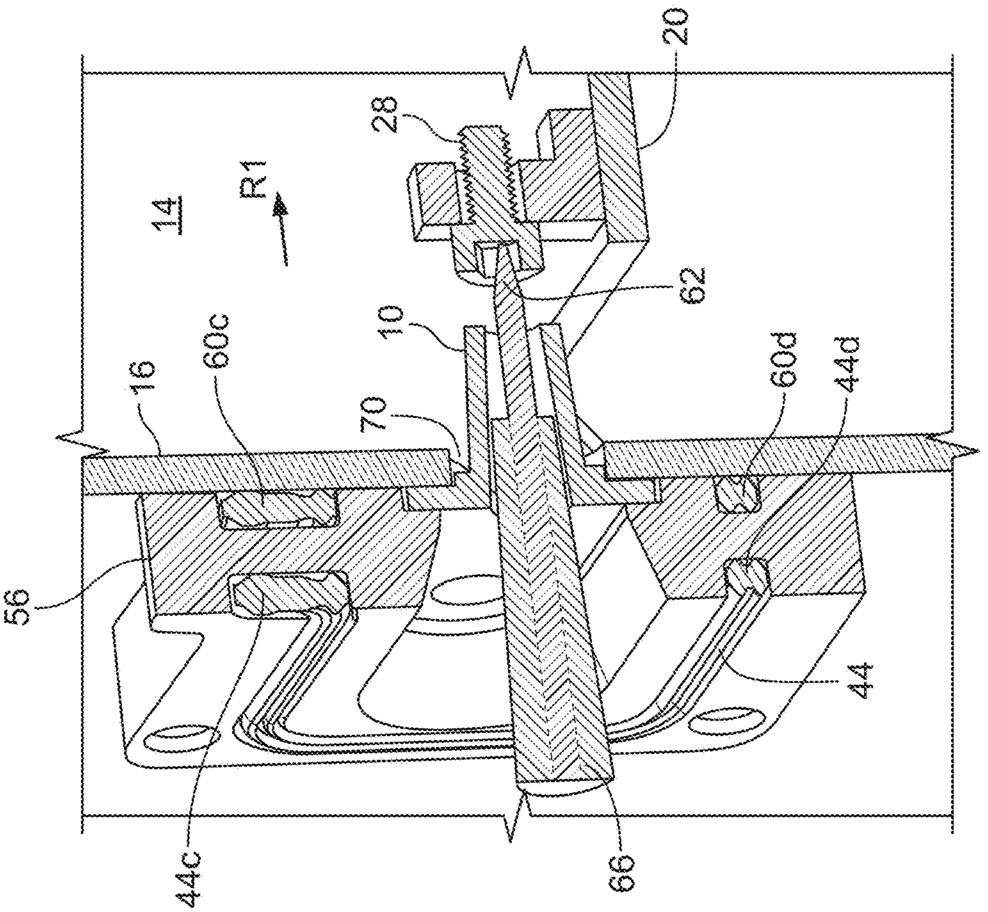
Figure 7A:
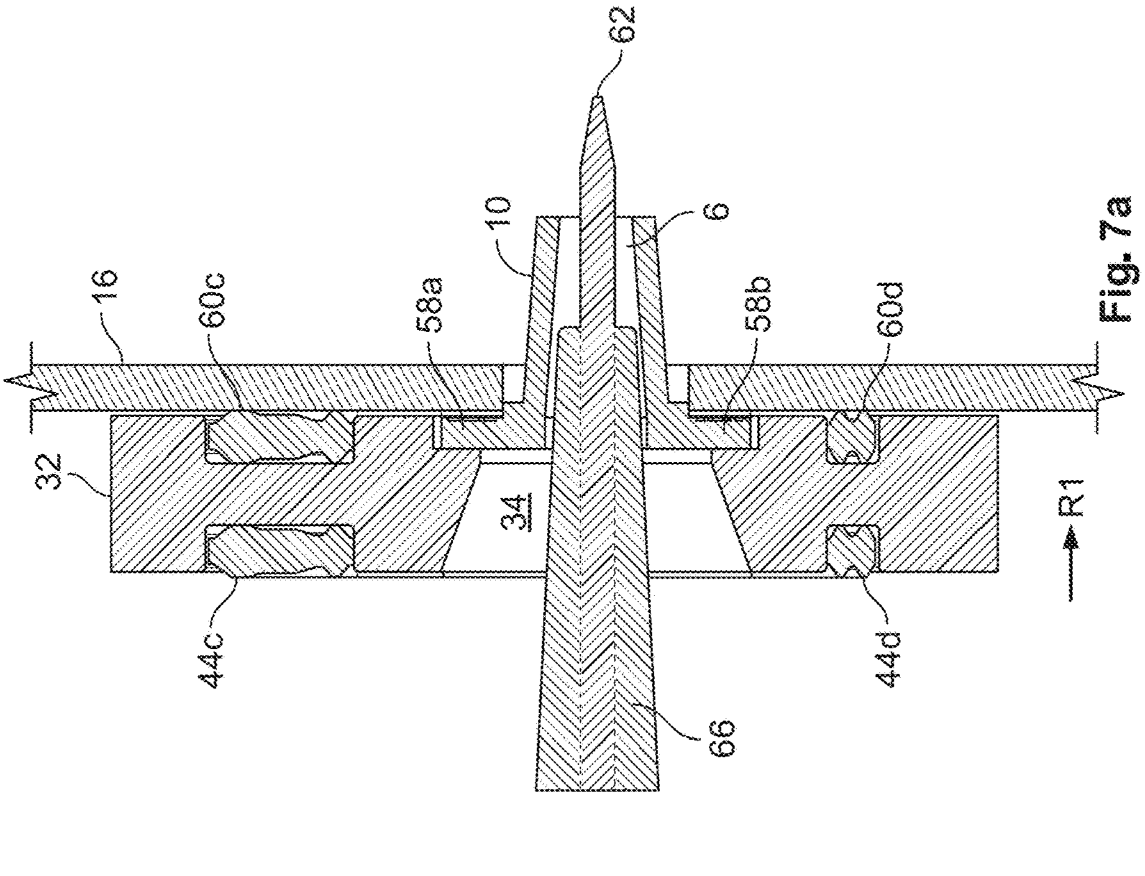
Figure 8:
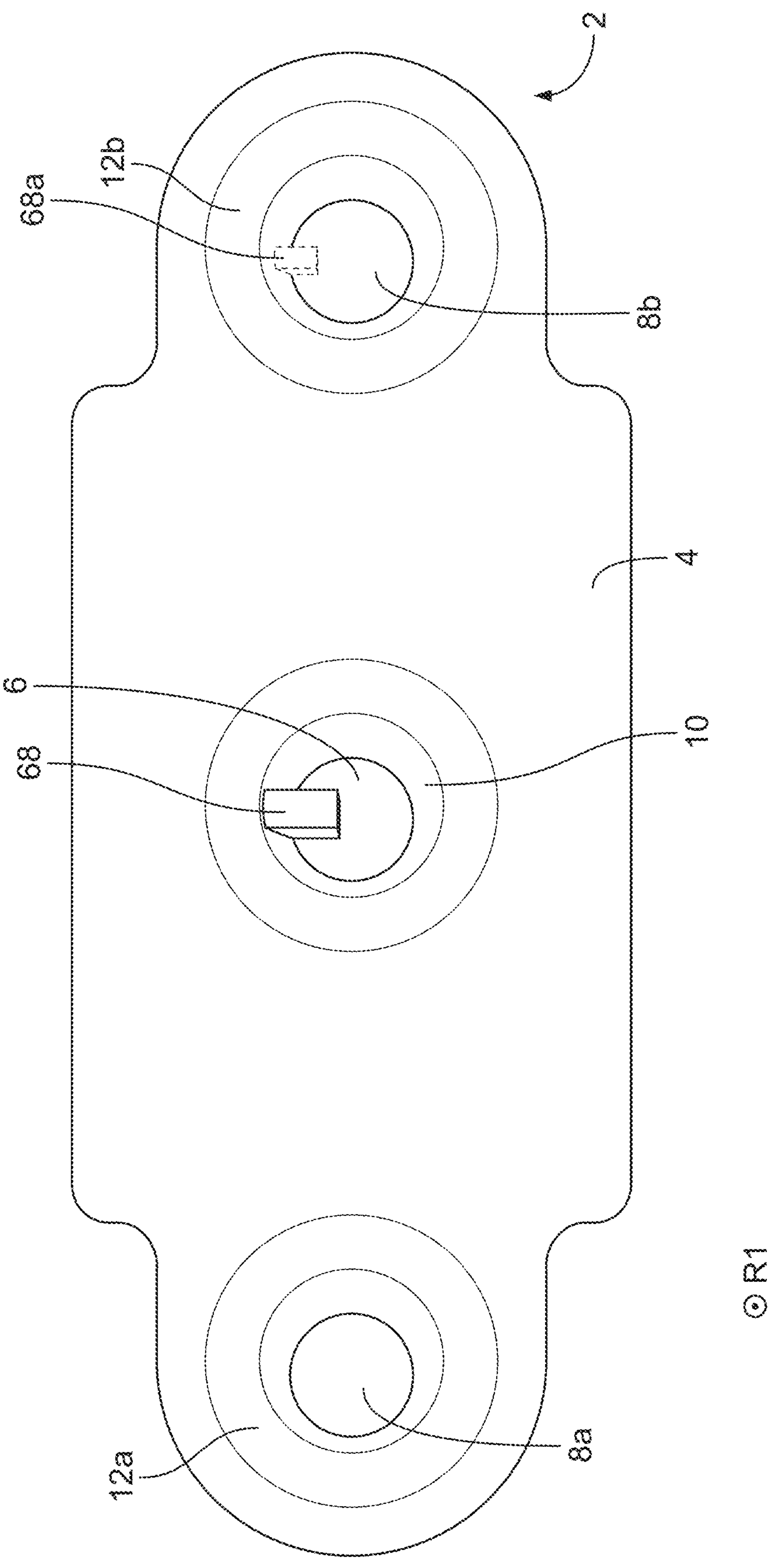
Figure 9:
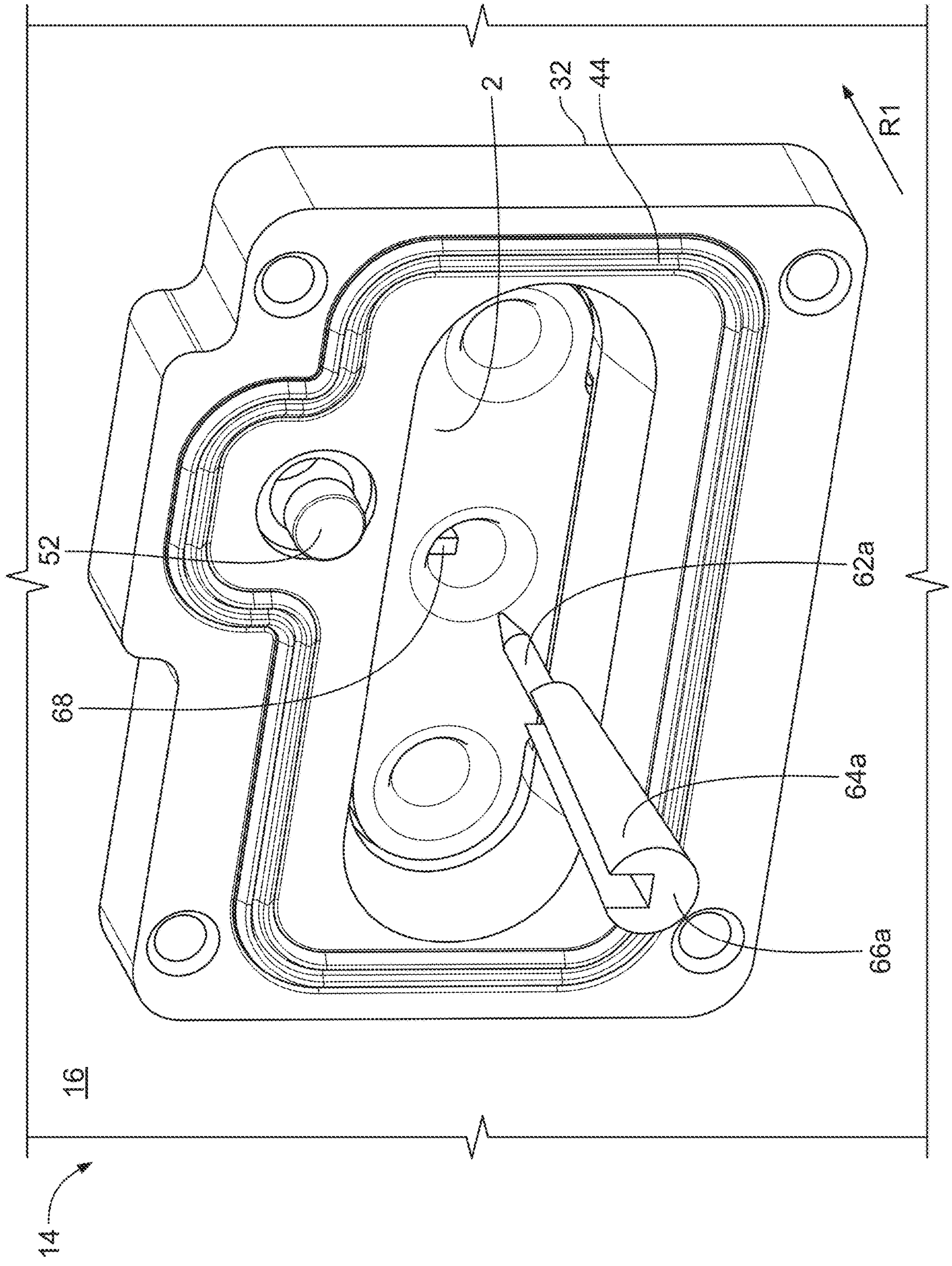
Figure 10:
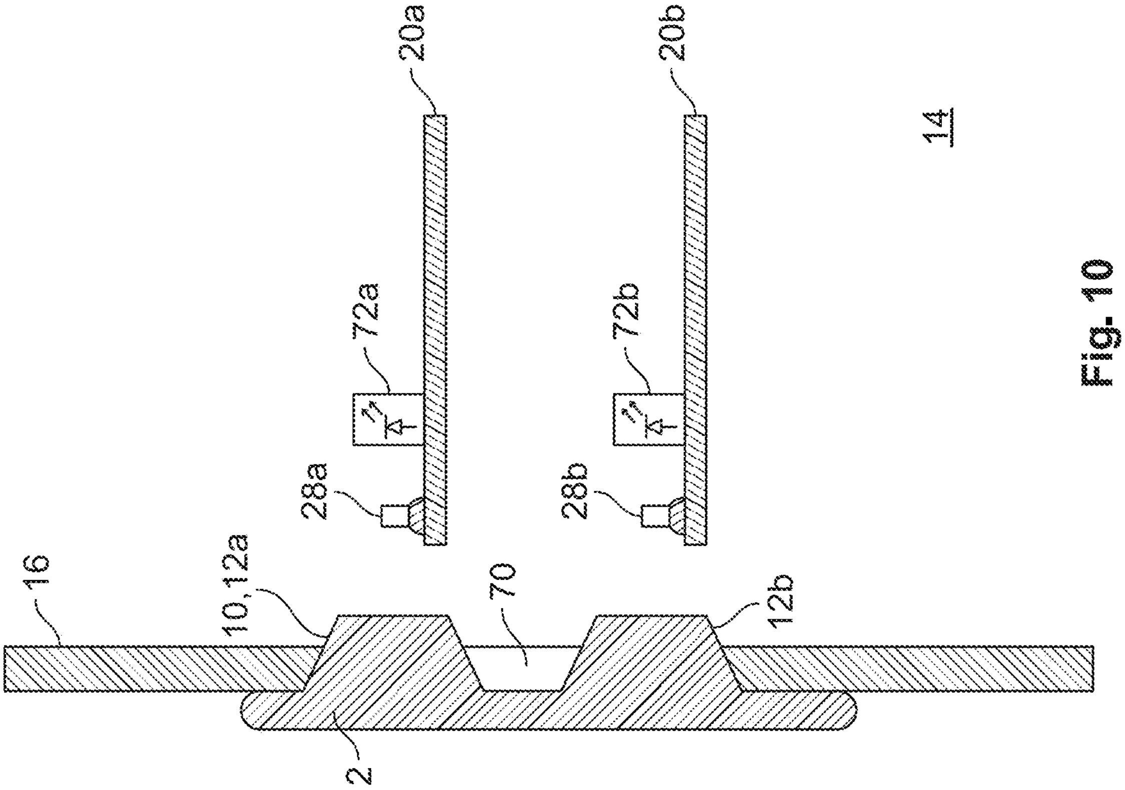

It is shown by:

FIG. 1 an electrically insulating test cap;

FIG. 2 a housing or a high-voltage box;

FIG. 3 a circuit board with several circuits;

FIG. 4 an exemplary configuration of a measurement access in the closed state;

FIG. 5 the exemplary configuration of the measurement access in an exploded view;

FIG. 6*a* a sectional view of the measurement access with a test cap according to the invention;

FIG. 6*b* a perspective sectional view of FIG. 6*a* with a housing or a high-voltage box;

FIG. 7*a* a sectional view of the test cap with test pin according to the invention;

FIG. 7*b* a perspective sectional view of FIG. 7*a* with a housing or a high-voltage box;

FIG. 8 a perspective view of a test cap according to the invention;

FIG. 9 a perspective view of a test cap and a housing according to the invention; and FIG. 10 a sectional view of a test cap according to the invention in a housing with several circuit boards.

FIG. 1 shows an electrically insulating test cap 2. The test cap 2 has a base body 4 in which at least one test opening 6 is arranged. According to the embodiment shown, the test cap 2 comprises at least one test opening 6 and an additional test opening 8*a*. The respective test openings can be enclosed by a tubular sheathing 10 or 12*a*. For example, the test opening 6 is enclosed by the sheathing 10 in the embodiment shown. The adjacent sheathing 12*a*, which encloses the test opening 8*a*, extends in the same longitudinal direction as the sheathing 10. The longitudinal direction used here also corresponds to an axial direction about which the sheathing encloses the test opening.

The base body 4 can be configured as a disk, flange or plate. Optionally, the base body 4 can be provided with rounded corners. In the embodiment shown in FIG. 1, the base body 4 has a plate-like shape with rounded corners. The longitudinal direction of the test cap described above does not specify an expansion direction of the base body, but corresponds to the axial direction of the sheathing.

The test cap 2 shown in FIG. 1 comprises two test openings 6 and 8*a*. The two test openings 6 and 8*a* are arranged adjacent to each other. The base body 4 is pierced by the two test openings 6 and 8*a*. As explained above, a tubular sheathing 10 and 12*a* can enclose the respective test openings 6 and 8*a*. Accordingly, the sheathings 10 and 12*a* can also be arranged adjacent to each other. In particular, the sheathings 10 and 12*a* can be arranged adjacent to each other transversely to the longitudinal direction of the sheathing.

FIG. 2 shows a high-voltage box 14 or housing with a measurement access 18 attached to its outer wall 16. The measurement access 18 is preferably arranged at the same level as a circuit board 20 arranged in the high-voltage box. The circuit board 20 is preferably equipped with a high-voltage board or with high-voltage components. The high-voltage box 14 can accommodate not only one circuit board 20 or one high-voltage board, but also several high-voltage boards inside the box 14. Preferably, a test contact is arranged at the edge of the high-voltage board at the level of the measurement access 18. The test contact can be electrically conductively connected to the circuit board 20. A high-voltage board can have several interconnectable circuits. These can also be arranged on the same circuit board 20 and can be decoupled or electrically isolated from each other. The circuits separated from each other can have a different electrical potential.

FIG. 3 shows an exemplary circuit board 20 with two switching circuits 22*a* and 22*b*. By means of a relay 24 in the first circuit 22*a*, a switch 26 in the second circuit 22*b* of the circuit board 20 can be controlled. Furthermore, the circuit board 20 has two test contacts 28*a* and 28*b* for the respective switching circuit 22*a* and 22*b*. Here, the test contact 28*a* is electrically conductively connected to the circuit 22*a*. In a corresponding manner, the test contact 28*b* is electrically conductively connected to the circuit 22*b*. Even if, in the example shown, the second circuit 22*b* can be controlled by a relay 24 of the first circuit 22*a*, the second circuit 22*b* can also be supplied with voltage independently of the first circuit 22*a*. Advantageously, the electrical potential at the respective circuit and thus on the circuit board 20 can be determined by the respective test contact 28*a* and 28*b* of the corresponding circuit 22*a* and 22*b*. The test contacts 28 are high-voltage contacts.

As shown in FIG. 2, the high-voltage box 14 can comprise a control unit 30. The control unit 30 is preferably electrically connected to the circuit boards 16 accommodated in the high-voltage box. The control unit 30 can also interrupt a power supply to the circuit boards 16. Furthermore, the control unit 30 can be connected to a sensor of the measurement access 18 via a signal line (for example a cable). When a cover of the measurement access 18 is opened, the sensor can signal that the measurement access is not closed. Thus, the control unit 30 can interrupt the power supply to the circuit board(s) 16 depending on the sensor signal.

FIGS. 4 and 5 show an exemplary configuration of a coverable measurement access 18 for the high-voltage box 14. FIG. 4 shows the measurement access 18 in the closed state. FIG. 5 shows the measurement access 18 in an exploded view or drawing, in which components that are covered in FIG. 4 are also visible. The exemplary measurement access 18 is configured as a component to be attached to a high-voltage box 14. The measurement access 18 comprises a frame 32 as a main body enclosing an opening 34. Alternatively, the frame 32 may be an integral part of an outer wall 16 of a housing or the high voltage box 14. The frame 32 is also referred to as the cover frame in this document. The opening 34 can be covered with a cover 36. For example, the cover can be attached to the frame 32 with screws 38*a*-38*d*. For this purpose, the cover frame 32 is provided with threaded holes 40*a*-40*d* in the respective corners of the frame. At correspondingly opposite positions to the threaded holes 40*a*-40*d*, the cover 36 has through-openings 42*a*-42*d*, each of which is configured to receive a screw 38*a*-38*d*. Alternatively, the cover 36 can be attached to the cover frame 32 as a flap with a hinge mechanism. Furthermore, the measurement access 18 preferably has a seal 44 between the cover 36 and the frame 32. A bead surrounding the opening 34 is configured to receive the seal 44. The seal 44 seals the opening 34 against the ingress of moisture. Optionally, the cover frame 32 can have a further opening 46. Preferably, the further opening 46 is arranged within the bead 50 so that the opening can also be enclosed by the seal 44. The further opening 46 is alternatively referred to in the document as sensor receptacle 46. A non-contact sensor 48 or a touch sensor 48 can be mounted in the sensor receptacle 46. Non-contact sensors are known from the prior art as ultrasonic sensors, capacitive distance sensors, inductive distance sensors, reed switches, etc. As touch sensors, for example, a pressure switch can be provided in the sensor receptacle 46. The sensor 48 is preferably configured to signal the opening of the cover 36. In the case of a distance sensor, the distance determined by the sensor would change and thus trigger a control signal in the control unit 30 so that the circuit board 20 is de-energized. FIGS. 4 and 5 show a reed switch 48 as the sensor 48. In its simplest form, the reed switch 48 consists of a pair of ferromagnetic flexible metal contacts in a hermetically sealed glass sleeve. Usually, the contacts are normally open and close when a magnetic field is present, or they may be normally closed and open when a magnetic field is applied. For example, a magnet 52 may be mounted at the same level as the sensor receptacle 46 on the inside of the cover 36. In interaction with the reed switch 48, the magnetic field of the magnet 52 can switch the reed switch 48 and trigger a control signal at the control unit 30. Thus, when the cover 36 is opened, removed or even just moved, an open state of the measurement access 18 can be detected. The opening 34 of the cover frame 32 is alternatively referred to in the document as a recess in a housing wall.

The cover frame 32 can alternatively also be a housing wall or thus be designated as such, which is covered by the cover 36. The opening 34 is preferably configured to accommodate an electrically insulating test cap 2 in a longitudinal direction R1. Preferably, the test cap 2 pierces or penetrates the housing wall 16 into the interior of the housing 14 or the high-voltage box 14.

The electrically insulating test cap 8 comprises a base body 4 with at least one test opening 8*a*, 8*b* or 6. The electrically insulating test cap shown in FIG. 4 is provided with three test openings 8*a*, 8*b* and 6 arranged next to each other. Alternatively, the electrically insulating test cap 2 can be provided with only one test opening 6 or with two test openings 8*a* and 8*b* or 6 and 8*a*. The test openings 6, 8*a* and 8*b* can each be provided with a tubular sheathing 10, 12*a* and 12*b*. Preferably, the sheathing tapers away from the base body 4 in the longitudinal direction R1 of the sheathing. Preferably, the electrically insulating test cap can be arranged at the level of a test contact 28, 28*a*, 28*b* of a circuit board 20 of the high-voltage box 14. In particular, a test opening 6, 8*a* and 8*b* can be arranged at the level of the test contact 28, 28*a* and 28*b*.

In other words, the test cap can also be referred to as a test rivet or test sleeve, with the respective sheathing forming a pocket.

The coverable measurement access 18 shown in FIGS. 4 and 5 is provided with the optional protrusions 54 and 56 of the cover 36 and the frame 32, respectively, which project transversely to the longitudinal direction. The main body of the measurement access 18 could alternatively be rectangular or round in shape. In the example shown, the main body of the measurement access 18 is provided with rounded corners.

A test cap 2 according to the invention is illustrated in FIG. 5*a* in the state inserted into a housing wall or outer wall 16. FIG. 5 shows a sectional view along the longitudinal direction of the test cap or sheathing 10.

In sections, the base body 4 of the test cap can form a collar 58*a* and 58*b* around the test opening 6.

FIG. 6*a* further illustrates the measurement access 18 in the closed state together with the inserted test cap 2. FIG. 6*b* shows a perspective sectional view of the test cap 2 as it protrudes in a high-voltage box 14 through an outer wall 16 or housing wall 16 into the interior of the housing 14 or the box 14. In particular, it can be seen in FIG. 6*b* that the sheathing 10, 12 protrudes into the housing in the longitudinal direction. In other words, the base body 4 of the test cap 2 and a proximal end of the sheathing 10 leading into the interior of the housing 14 are located outside the housing 14 or the high-voltage box 14.

FIG. 6*b* further shows the measurement access 18 in a perspective sectional view with the test cap 2 inserted. The sectional plane of the view runs along the longitudinal direction R1 at the level of a centrally arranged test opening 6 of the electrically insulating test cap 2. As is further shown in FIG. 6*b*, the test cap 2 or the sheathing 10 is arranged at the level of a test contact 28 of the circuit board 20 in the housing or the high-voltage box 14. Thus, the test contact 28 can be accessed through the test cap 2.

The test contact 28 can be arranged at the edge of the circuit board. In particular, the insulator receptacle 34 of the measurement access 32 can also be arranged at the level of the test contact 28 of the circuit board 20.

Thus, a test pin can be used to make electrically conductive contact with the test contact 28 through a test opening 6, 8*a* or 8*b*. At the proximal end of the tubular sheathing 10, the base body of the test cap 2 forms a collar 58*a* and 58*b* extending around the test opening 6, which can be abutted against an outer wall 16 of the housing or the high-voltage box 14 or the measurement access 32.

Furthermore, in the exemplary configuration in FIG. 6*a*, a further seal 60 with opposing sealing webs 60*c* and 60*d* is shown. Like the seal 44, the further seal 60 can also enclose the opening 34 and be inserted into a bead of the frame 32. The further seal 60 can be used if the frame 32 is not an integral part of the outer wall 16 of the high-voltage box 14, but is attached to the outer wall 16. The further seal 60 seals the interface between the outer wall 16 and the frame 32 from moisture ingress. Likewise shown are opposing sealing webs 44*a* and 44*b* of the cover-side seal 44.

FIG. 7*a* shows the same sectional view as FIG. 6*a*, but with a test pin 66 inserted in the test cap 2. The test pin 66 preferably comprises an electrically conductive contact tip 62, which is inserted in a contact tip receptacle 64 of the test pin 66.

Accordingly, FIG. 7*b* shows a perspective sectional view of the test cap 2 according to the invention in a high-voltage box 14 with test pin 66 inserted—in the longitudinal direction R1. The test pin 66 penetrates the test cap 2 and contacts the test contact 28 inside the high-voltage box 14.

According to a further preferred configuration, the test cap 2 can have a coding element 68. In the exemplary configuration shown in FIG. 8, the coding element 68 is arranged on the inner wall of the sheathing 10. Even if the configuration shown is a coding element 68 in the centrally arranged test opening 6, a test cap 2 of any configuration can be provided with a coding element 68. For example, the coding element 68—as shown with reference to the coding element 68*a*—can alternatively or cumulatively be arranged inside the sheathing 12*b*.

The coding element 68 is, for example, a coding rib. In particular, if the test cap has more than one coding element, the coding elements can differ from one another in their outer contour in a cross-sectional plane relative to the longitudinal direction R1.

FIG. 9 shows an enlarged perspective view of a test cap 2 according to the invention with coding element 68. In the exemplary configuration, a measurement access 18 in the open state and a test pin 66*a* are also shown. As shown in FIG. 6*b*, the test cap 2 in FIG. 9 is also inserted into an outer wall 16 of the high-voltage box 14 or of a housing 14 in the longitudinal direction R1 of the test cap 2.

The test pin 66*a* differs from the test pin 66 of FIG. 7*b* in that the contact tip receptacle 64*a* of the test pin 66 has a recess that allows a coding element 68 of the test cap to be received along the longitudinal direction R1. In particular, the contact tip receptacle 64*a* can have an outer contour in the cross-sectional plane with respect to the longitudinal direction R1 that is complementary to the coding element 68.

Due to the possible high voltage at the high-voltage box 14, not any test pin 66 can be used. According to a further preferred configuration, the test pin 66*a* can be provided with a recess. The recess corresponds to a protrusion 68 or a coding element 68 arranged in the test opening 6. In a preferred manner, the coding element 68 can prevent the insertion of a test pin 66 that is incompatible with the high-voltage box 14. The coding element 68 acts as a mechanical obstacle for a test pin 66 that lacks the recess of the test pin 66*a*.

According to a further preferred configuration, a housing or a high-voltage box 14 can accommodate not only one, but several circuit boards 20. In the following, the use of the test cap according to the invention for a housing with several circuit boards 20*a* and 20*b* is explained with reference to FIG. 10. The circuit boards 20*a* and 20*b* can be arranged vertically or horizontally adjacent to each other. As shown in FIG. 10, the sheathing 12*a* or 12*b* pierces or penetrates the outer wall 16 of the housing or high-voltage box 14 into the interior of the housing or high-voltage box 14. In other words, the test cap 2 can be inserted into a recess or hole 70 in the outer wall 16.

The circuit board 20*a* has a test contact 28*a* arranged at the edge of the circuit board 20*a*. Preferably, the test contact 28*a* is located flush at the same level as the sheathing 12*a* of the test cap 2. Cumulatively, the circuit board 20*a* can have a light source 72*a*, which is arranged flush with the test contact 28*a* and the test cap 2. Even if the explanations of the light source 72*a* are explained here for a high-voltage box 14 with several circuit boards 16*a* and 16*b*, a high-voltage box with only one circuit board can also be provided with such a light source. Likewise, a circuit board 20 with several circuits as in FIG. 3 can be provided with such a light source 72 downstream of a respective test contact 28.

In the configuration shown in FIG. 10, the second circuit board 20*b* is identical to the first circuit board 20*a*. In particular, the second circuit board 20*b* also has a test contact 28*b* arranged flush with the corresponding additional test opening 8*b* or the associated sheathing 12*b*. The second circuit board 20*b* can also have a light source 72*b*. Preferably, the light source 72*b* is also arranged flush with the test opening or the sheathing 12*b*.

The light source 72*a* or 72*b* can signal the presence of a high voltage at the respective or corresponding circuit board 20 or circuit 22 of the circuit board 20. For example, the light source 72 can light up, i.e. be active, when a high voltage is present at the circuit board 20 or the circuit 22 of the circuit board 20.

The light source 72 can be configured as an electrical light source, for example as a light-emitting diode. Furthermore, the light source can be replaced by a mechanical switch. Alternatively, the light source 72 may additionally be provided with a mechanical switch.

REFERENCE SIGNS

2 test cap
4 base body
6 test opening
8, 8*a* additional test opening
10 sheathing
12, 12*a* additional sheathing
14 high-voltage box
16 outer wall
18 measurement access
20, 20*a*, 20*b* circuit board
22, 22*a*, 22*b* circuit
24 relay
26 switch
28, 28*a*, 28*b* test contact
30 control unit
32 frame
34 opening
36 cover
38*a*-38*d* screws
40*a*-40*d* threaded hole
42*a*-42*d* through-opening
44, 44*a*-44*d* seal
46 further opening
48 sensor
50 bead
52 magnet
54 protrusion
56 protrusion
58*a*, 58*b* collar
60, 60*a*-60*d* seal
62 contact tip
64 contact tip receptacle
66 test pin
68, 68*a* coding element
70 hole, recess
72, 72*a*, 72*b* light source
R1 longitudinal direction

The invention claimed is:

1. An electrically insulating test cap for a high-voltage contact, comprising:
a base body,
a test opening piercing the base body,
an additional test opening piercing the base body,
wherein a tubular sheathing encloses the test opening and leads away from the base body in a longitudinal direction of the sheathing;
wherein the additional test opening being enclosed by an additional tubular sheathing, and the additional sheathing of the additional test opening extending away from the base body in the same longitudinal direction.

2. The test cap according to claim 1, wherein the sheathing tapers away from the base body.

3. The test cap according to claim 1, wherein at least one coding element projects from the inside of the sheathing transversely to the longitudinal direction of the sheathing.

4. The test cap according to claim 3, wherein an additional coding element projects from the inside of the additional sheathing transversely to the longitudinal direction and wherein, in a cross-sectional plane to the longitudinal direction, an outer contour of the coding element differs from the outer contour of the additional coding element.

5. A high-voltage box, comprising:
an outer wall accommodating an electrically insulating test cap according to claim 1; and
a high-voltage board with a test contact arranged at the level of the test cap.

6. The high-voltage box according to claim 5, wherein the test opening is arranged flush with the test contact of the high-voltage board.

7. The high-voltage box according to claim 5, wherein:
the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, further comprising:

an additional high-voltage board with an additional test contact, which is arranged at the level of the additional test opening.

8. The high-voltage box according to claim 5, wherein the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, and the high-voltage board comprises at least two electrically separate high-voltage circuits each having separate, adjacent test contacts (28*a*, 28*b*) which are each accessible through the test cap.

9. The high-voltage box according to claim 5, wherein the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, further comprising a test pin with a rod-like contact tip receptacle, wherein the contact tip receptacle has a recess for receiving the coding element.

10. The high-voltage box according to claim 5, wherein the high-voltage board comprises a light source arranged flush with the test cap and configured to signal a presence of a high-voltage at the high-voltage board.

11. A housing for a high voltage box, comprising:

a housing wall, an electrically insulating test cap for a high-voltage contact, the electrically insulating test cap extends through the housing wall into the interior of the housing, the electrically insulating test cap comprising:

a base body, at least one test opening piercing the base body, wherein a tubular sheathing encloses the test opening and leads away from the base body in a longitudinal direction of the sheathing.

12. The housing according to claim 11, wherein the housing wall has a recess into which the test cap is inserted.

13. A high-voltage box, comprising:

a housing according to claim 11; and a high-voltage board with a test contact arranged at the level of the test cap.

14. The high-voltage box according to claim 13, wherein the test opening is arranged flush with the test contact of the high-voltage board.

15. The high-voltage box according to claim 13, wherein:

the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, further comprising:

an additional high-voltage board with an additional test contact, which is arranged at the level of the additional test opening.

16. The high-voltage box according to claim 13, wherein the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, and the high-voltage board (20) comprises at least two electrically separate high-voltage circuits each having separate, adjacent test contacts which are each accessible through the test cap.

17. The high-voltage box according to claim 13, wherein the test cap comprises, comprises, in addition to the test opening, an additional test opening piercing the base body, wherein the additional test opening is enclosed by an additional tubular sheathing, and the additional sheathing of the additional test opening extends away from the base body in the same longitudinal direction, further comprising a test pin with a rod-like contact tip receptacle, wherein the contact tip receptacle has a recess for receiving the coding element.

18. The high-voltage box according to claim 13, wherein the high-voltage board comprises a light source arranged flush with the test cap and configured to signal a presence of a high-voltage at the high-voltage board.

19. The high-voltage box according to claim 13, wherein the material of the test cap is translucent in sections.

* * * * *